(12) United States Patent
Lee et al.

(10) Patent No.: US 9,318,515 B2
(45) Date of Patent: Apr. 19, 2016

(54) METHOD OF FORMING A CONDUCTIVE PATTERN, METHOD OF MANUFACTURING A DISPLAY SUBSTRATE USING THE METHOD, AND DISPLAY SUBSTRATE

(75) Inventors: Dae-Young Lee, Suwon-si (KR);
Yong-Su Lee, Hwaseong-si (KR);
Gug-Rae Jo, Asan-si (KR); Hyung-Bin Cho, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 554 days.

(21) Appl. No.: 13/589,322

(22) Filed: Aug. 20, 2012

(65) Prior Publication Data
US 2013/0256667 A1     Oct. 3, 2013

(30) Foreign Application Priority Data
Mar. 28, 2012    (KR) ........................ 10-2012-0031443

(51) Int. Cl.
| H01L 29/786 | (2006.01) |
| H01L 21/302 | (2006.01) |
| H01L 27/12  | (2006.01) |
| H01L 29/45  | (2006.01) |

(52) U.S. Cl.
CPC ........ *H01L 27/1292* (2013.01); *H01L 27/1218* (2013.01); *H01L 29/458* (2013.01)

(58) Field of Classification Search
CPC ...... H01L 29/786; H01L 21/302; H01L 33/08
See application file for complete search history.

(56) References Cited

U.S. PATENT DOCUMENTS

| 2006/0139406 A1* | 6/2006 | Tsuchiya et al. ................. 347/54 |
| 2007/0085112 A1* | 4/2007 | Yamazaki et al. ............. 257/288 |
| 2012/0161138 A1* | 6/2012 | Okumoto et al. ................ 257/59 |

FOREIGN PATENT DOCUMENTS

| JP | 2009-016490 A | 1/2009 |
| KR | 1020080065769 A | 7/2008 |
| KR | 1020100027842 A | 3/2010 |

* cited by examiner

*Primary Examiner* — Mohammad Choudhry
(74) *Attorney, Agent, or Firm* — Cantor Colburn LLP (57) ABSTRACT

A method of forming a conductive pattern includes forming a trench on a substrate, and providing a conductive ink to the trench while an electric field is generated between the substrate and a nozzle which ejects the conductive ink.

9 Claims, 9 Drawing Sheets

METHOD OF FORMING A CONDUCTIVE PATTERN, METHOD OF MANUFACTURING A DISPLAY SUBSTRATE USING THE METHOD, AND DISPLAY SUBSTRATE

This application claims priority to Korean Patent Application No. 10-2012-0031443, filed on Mar. 28, 2012, and all the benefits accruing therefrom under 35 U.S.C. §119, the content of which in its entirety is herein incorporated by reference.

BACKGROUND

1. Field

Exemplary embodiments of the invention relate to a method of forming a conductive pattern, a method of manufacturing a display substrate, and a display substrate. More particularly, exemplary embodiments of the invention relate to a method of forming a thick conductive pattern, a method of manufacturing a display substrate using the method, and a display substrate.

2. Description of the Related Art

As display devices for displaying an image in high quality become larger, a signal line for applying a gate driving signal or a data driving signal may become thinner and longer. When the signal line is substantially thin, the aperture ratio of the display device increases. However, the resistance of the signal line also increases such that resistive-capacitive ("RC") delay may occur therein. To prevent the RC delay, the signal line may be formed of low resistive metal or the thickness of the signal line may be increased.

Various methods are known as methods of forming the signal line such as sputtering, electroless plating, ink jetting and printing using a blade, for example. However, when a signal line is formed by printing an ink using a blade on a trench formed on a substrate, it may be difficult to completely fill the ink on the trench corresponding to a signal line having a complex shape. In addition, it may be difficult to uniformly fill the ink on the trench due to the pressure that the blade applies on the substrate.

When a thick signal line is formed by sputtering, an increased amount of stress is applied on the substrate during the sputtering process and a deformational difference between the substrate and a metal layer on the substrate may cause a warping of the substrate such that the reliability of subsequent processes substantially decreases. When a signal line is formed by electroless plating, additional processes may be performed to form a seed layer on the substrate, and the processes take a long time to grow a metal film on the seed layer. The electroless plating also includes a grinding process to flatten a surface of the metal film. When a signal line is formed by ink jetting, it is difficult to form a finely designed pattern because it is difficult to adjust the size of a droplet dropping from a nozzle.

Thus, by using methods of sputtering, electroless plating, ink jetting, or printing using a blade, it may be difficult to form a signal line whose thickness is thick, for example, about 1 micrometer (μm) or more.

SUMMARY

Exemplary embodiments of the invention provide a method of easily manufacturing a thick conductive pattern which improves manufacturing reliability.

Exemplary embodiments of the invention also provide a method of manufacturing a display substrate using the method of manufacturing the conductive pattern.

Exemplary embodiments of the invention still also provide a display substrate including thick signal lines and electrodes.

In an exemplary embodiment of a method of forming a conductive pattern according to the invention, the method includes forming a trench on a substrate, and providing a conductive ink to the trench while an electric field is generated between the substrate and a nozzle which injects the conductive ink.

In an exemplary embodiment, a first voltage may be applied to the nozzle, a second voltage may be applied to the substrate, and a polarity of the second voltage may be different from a polarity of the first voltage.

In an exemplary embodiment, the forming the trench on the substrate may include providing a photo pattern on the substrate, where the photo pattern partially exposes a surface of the substrate, and etching the substrate using the photo pattern as an etch stopping layer. In such an embodiment, a first voltage may be applied to the nozzle, a second voltage may be applied to the substrate, and a polarity of the second voltage is different from a polarity of the first voltage.

In an exemplary embodiment, a conductive ink may be provided to the trench while a third voltage is applied to the photo pattern. In such an embodiment, a polarity of the third voltage is the same as the polarity of the first voltage, and a voltage level of the third voltage is lower than a voltage level of the first voltage.

In an exemplary embodiment, the forming the trench on the substrate may include providing an organic layer on the substrate, providing a photo pattern on the substrate on which the organic layer is disposed, where the photo pattern partially exposes the organic layer, and patterning the organic layer using the photo pattern as an etch stopping layer. In such an embodiment, a first voltage may be applied to the nozzle, a second voltage may be applied to the substrate, a polarity of the second voltage is different from a polarity of the first voltage, and the trench is defined on the organic layer.

In an exemplary embodiment, the conductive ink may be provided to the trench while a third voltage is applied to the photo pattern. In such an embodiment, a polarity of the third voltage is the same as the polarity of the first voltage, and a voltage level of the third voltage is lower than a voltage level of the first voltage.

In an exemplary embodiment, the providing the conductive ink to the trench may include disposing a mask between the nozzle and the substrate, where the mask includes an open pattern corresponding to the trench, and injecting the conductive ink toward trench on the substrate through the open pattern of the mask.

In an exemplary embodiment, a first voltage may be applied to the nozzle, a second voltage may be applied to the substrate, a polarity of the second voltage may be different from a polarity of the first voltage, a third voltage may be applied to the mask, a polarity of the third voltage may be the same as the polarity of the first voltage, and a voltage level of the third voltage may be lower than a voltage level of the first voltage In an exemplary embodiment of a method of manufacturing a display substrate according to the invention, the method includes forming a trench on a substrate, forming a first signal line by providing the trench with a conductive ink while an electric field is generated between the substrate and a nozzle, where the nozzle injects the conductive ink, forming a second signal line on the substrate, where the second signal line crosses the first signal line, and forming a pixel electrode on the substrate on which the first signal line and the second signal line are provided.

In an exemplary embodiment, the method may further include before forming the trench on the substrate, forming the second signal line and a gate electrode and then forming a semiconductor pattern on the substrate, where the gate electrode is connected to the second signal line, and the semiconductor pattern overlaps the gate electrode, and before the forming the trench on the substrate providing a source electrode and a drain electrode on the substrate on which the semiconductor pattern provided, where each of the source electrode and the drain electrode overlap the semiconductor pattern, and. In such an embodiment, the forming the trench on the substrate may include providing an organic layer on the substrate, on which the source electrode and the drain electrode are provided, and forming the trench and a hole on the organic layer by patterning the organic layer, where the trench exposes the source electrode and the hole exposes the drain electrode.

In an exemplary embodiment, the providing the drain electrode may include providing a third signal line integrally connected to the source electrode and disposed in an area corresponding to the first signal line.

In an exemplary embodiment, the organic layer may be patterned using a photo pattern as an etch stopping layer, the photo pattern may be disposed on the organic layer, and the first signal line may be formed while voltages having different polarities are applied to the substrate and the nozzle, respectively.

In an exemplary embodiment, the method may further include before forming the trench on the substrate, forming the second signal line and a gate electrode on the substrate and then providing a semiconductor pattern on the substrate, where the gate electrode is connected to the second signal line and overlapping the semiconductor pattern. In such an embodiment, the forming the first signal line may include providing a source electrode connected to the first signal line and a drain electrode spaced apart from the source electrode.

In an exemplary embodiment, the forming the trench on the substrate may include providing a photo pattern on the substrate, and etching the substrate using the photo pattern as an etch stopping layer. In such an embodiment, the photo pattern may be removed after the first signal line is formed on the substrate on which the photo pattern is provided.

In an exemplary embodiment, the forming the trench on the substrate may include providing an organic layer on the substrate, patterning a photo pattern on the organic layer, and etching the organic layer using the photo pattern as an etch stopping layer. In such an embodiment, the photo pattern may be removed after the first signal line is formed on the substrate on which the photo pattern is provided.

In an exemplary embodiment, the method may further include before forming the second signal line, providing a semiconductor pattern on the substrate on which the first signal line and a gate electrode are formed, where the gate electrode is connected to the first signal line and overlapping the semiconductor pattern, and providing an organic layer including a trench formed thereon, where the trench of the organic layer partially exposes the semiconductor pattern, and the second signal line is formed on the trench of the organic layer.

In an exemplary embodiment, the method may further include providing a source electrode and a drain electrode before the forming the organic layer. In such an embodiment, each of the source electrode and the drain electrode may overlap the semiconductor pattern, and the second signal line may be in contact with the source electrode.

In an exemplary embodiment, the forming the first signal line may include providing a mask including an open pattern between the substrate and the nozzle after the forming the trench on the substrate, and injecting the conductive ink toward the trench on the substrate through the open pattern of the mask while a voltage is applied to the mask, where the open pattern of the mask corresponds to the trench, and where a polarity of the voltage applied to the mask is the same as the polarity of a voltage applied to the nozzle.

In an exemplary embodiment of a displaying substrate according to the invention, the displaying substrate includes a first signal line extending in a first direction on a substrate, an organic layer disposed on the first signal line, where a trench is formed on the organic layer, and the trench is extending in a second direction different from the first direction, a second signal line disposed in the trench of the organic layer, where the second signal line substantially completely fills the trench of the organic layer, a switching element including a gate electrode connected to the first signal line, a source electrode overlapping the gate electrode and in contact with the second signal line and a drain electrode spaced apart from the source electrode, and a pixel electrode connected to the switching element.

In an exemplary embodiment, the displaying substrate may further include a third signal line integrally formed with the source electrode and disposed on the trench according along the second signal line.

In an exemplary embodiment, the displaying substrate may further include a contact electrode which totally fills a hole exposing the drain electrode, where the contact electrode connects the drain electrode disposed on the organic layer to the pixel electrode.

According to exemplary embodiments of the method of manufacturing the conductive pattern, the method of manufacturing the display substrate and the display substrate, a conductive pattern is efficiently formed using fine droplets having a size less than about 100 nanometers (nm) on a trench defined on a substrate using an electrostatic injection method. In such an embodiment, the depth of the trench may be deeper than about 1 micrometer (μm), and manufacturing reliability of the conductive pattern may be improved using the electrostatic injection method. In such an embodiment, the thickness of the conductive pattern may be increased such that resistive-capacitive ("RC") delay may be substantially reduced or effectively prevented by decreasing the resistance of the conductive pattern.

In an exemplary embodiment, manufacturing reliability of the conductive pattern may be improved by using the electrostatic injection method, in which the fine droplets are selectively provided to the trench by applying a voltage on an independent mask or a photo pattern which becomes a mask.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

FIGS. 1A, 1B, 1C and 1D are cross-sectional views illustrating an exemplary embodiment of a method of manufacturing a conductive pattern according to the invention.

Figure 1A:
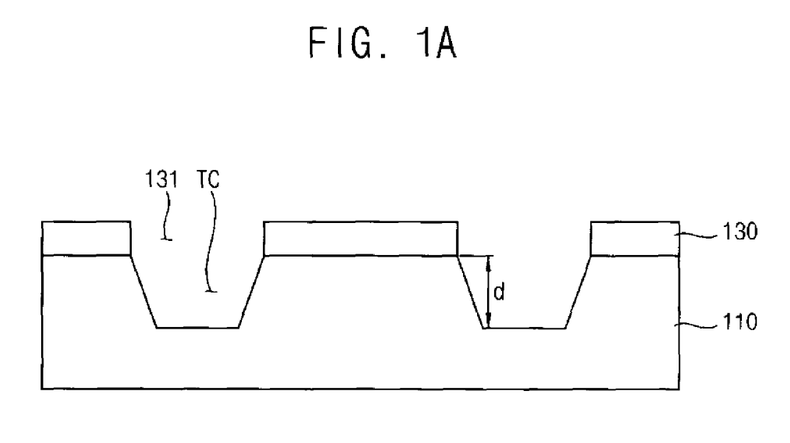
FIGS. 1A, 1B, 1C and 1D are cross-sectional views illustrating an exemplary embodiment of a method of manufacturing a conductive pattern according to the invention.

Referring to FIG. 1A, a photo layer is disposed on a base substrate 110, and a photo pattern 130 is provided by patterning the photo layer. The photo pattern 130 includes an opening 131 that exposes a surface of the base substrate 110. The opening 131 may have a shape extending in a direction of the base substrate 110.

In an exemplary embodiment, the photo pattern 130 may be provided using a negative type photo-resist composition including a monomer and a photoinitiator. In such an embodiment, a photo layer including the negative type photo-resist composition polymerizes the monomer by reacting to the photoinitiator in an exposure area, while the photo layer does not have a photoreaction in a non-exposure area. In such an embodiment, when the photo layer is developed using a developer after the exposure process, the photo pattern 130 remains in the exposure area, and the base substrate 110 is exposed in the non-exposure area.

In an alternative exemplary embodiment, the photo pattern 130 may be provided using a positive type photo-resist composition which includes a base resin and a photoacid generator. A photo layer including the positive type photo-resist composition dissolves the base resin to a developer by an acid generated from the photoacid generator in an exposure area, while the photo layer forms the photo pattern 130 by leaving the base resin in a non-exposure area.

In an exemplary embodiment, a trench TC is formed on the base substrate 110 by etching the base substrate 110 using the photo pattern as an etch stopping layer. In such an embodiment, the trench TC is directly formed on the base substrate 110.

The depth d of the trench TC may deeper than about 1 micrometer (μm). The depth d of the trench TC may be defined by the distance between an upper surface of the base substrate 110 and a bottom surface of the trench TC. The depth d of the trench TC may be substantially the same as the thickness of the conductive pattern to be manufactured.

Figure 1B:
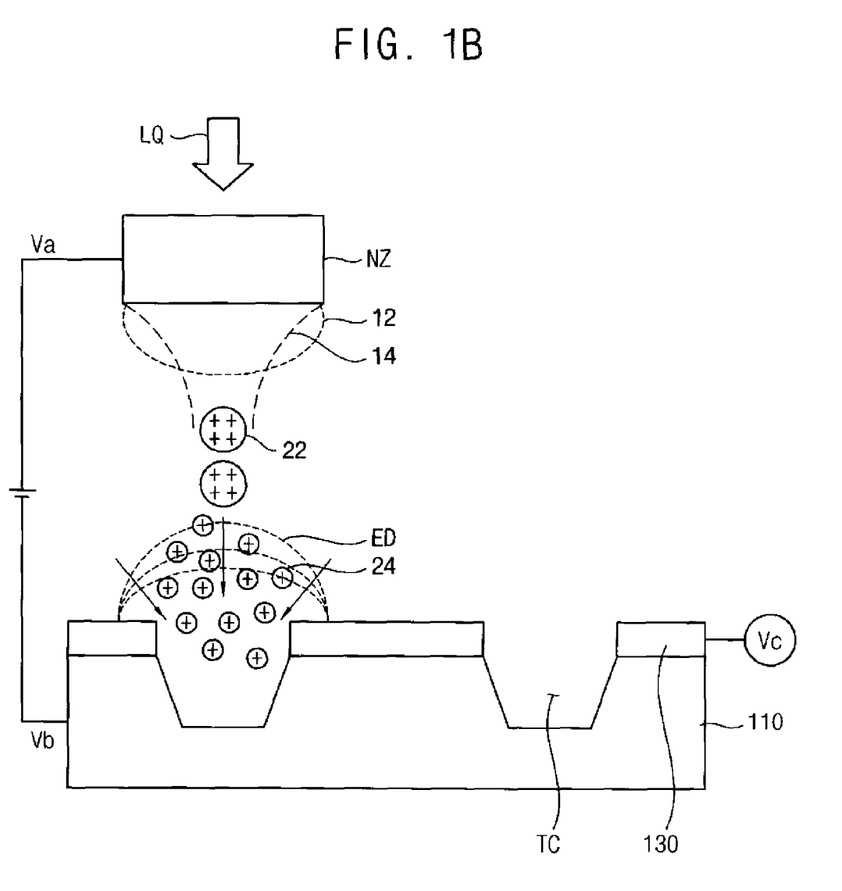

Referring to FIG. 1B, a conductive ink LQ is provided toward the trench TC formed on the base substrate 110. The conductive ink LQ is provided to the trench TC after the photo pattern 130 is provided on the base substrate 110.

The conductive ink LQ includes conductive particles and dispersive solvent which disperses the conductive particles. In an exemplary embodiment, the conductive particles include at least one of Ag and Cu, for example. In an exemplary embodiment, the dispersive solvent may include at least one of glycol, ethylene glycol ("EG"), isopropyl alcohol ("IPA"), toluene, ethanol and water, for example.

In an exemplary embodiment, the conductive ink LQ is provided using an electrostatic injection method. In such an embodiment, when the conductive ink LQ is provided toward the trench TC on the base substrate 110, an electric field is generated between the base substrate 110 and a nozzle NZ which ejects the conductive ink LQ therefrom. In such an embodiment, an electric field may be generated between the base substrate 110 and the nozzle NZ by applying different voltages to the base substrate 110 and the nozzle NZ, respectively. In such an embodiment, a first voltage Va may be applied to the nozzle NZ, and a second voltage Vb having different polarity from the first voltage Va may be applied to the base substrate 110.

In one exemplary embodiment, for example, the first voltage Va may have positive polarity, and the second voltage Vb may have negative polarity. In such an embodiment, the nozzle NZ becomes positive electrode, and the base substrate 110 becomes negative electrode such that a vertical electric field is generated between the nozzle NZ and the base substrate 110.

When the conductive ink LQ is not electrified and the electric field is not generated between the nozzle NZ and the base substrate 110, an initial droplet 12, which is on the inlet of the nozzle before the conductive ink LQ is ejected from the nozzle NZ, may have an elliptical shape by a surface tension between the conductive ink LQ and the nozzle NZ. The initial droplet 12 is pulled away from the nozzle NZ by the pressure applied to the nozzle such that the conductive ink LQ is ejected by the nozzle NZ.

In an exemplary embodiment, where the conductive ink LQ supplied to the nozzle NZ is positively electrified and the electric field is generated by positively electrifying the nozzle NZ, the shape of the conductive ink LQ is deformed under the influence of the electric field and the surface tension. In such an embodiment, the shape of the initial droplet 12 is transformed to a conical droplet 14 having a cone shape toward the base substrate 110 by the electric field and the surface tension such that the conical droplet 14 discharged from the nozzle NZ becomes a discharge droplet 22 substantially immediately after being discharged. In such an embodiment, the discharge droplet 22 remains positively electrified.

The discharge droplet 22 from the conical droplet 14 may have relatively smaller size than the discharged droplet from the initial droplet 12. While the initial droplet 12 and the discharged droplet from the initial droplet 12 may be substantially similar in size, the discharge droplet 22 from the conical droplet 14 may have finer size because the size of an end tip of the conical droplet 14 right before the discharging of the conical droplet 14 is smaller than the size an end tip of the initial droplet 12 right before the discharging of the initial droplet 12.

In an exemplary embodiment, the discharge droplet 22 extends toward the base substrate 110 along the direction of the electric field such that the discharge droplet 22 is finely dispersed to form a plurality of fine droplets 24. The fine droplets 24 also remains positively electrified. In an exemplary embodiment, the fine droplets 24 may have diameter of about 100 nanometers (nm) or less. In such an embodiment, for example, the diameter of the fine droplets 24 may be about 20 nm or less.

In an exemplary embodiment, the intensity of the vertical electric field may be changed based on the difference between the first voltage Va and the second voltage Vb. In such an embodiment, the size of the fine droplets 24 may be adjusted based on the intensity of the vertical electric field. In such an embodiment, the size of the fine droplets 24 may be adjusted by changing the distance between the nozzle NZ and the base substrate 110.

In an exemplary embodiment, a third voltage Vc having the same polarity as the first voltage Va and lower than the first voltage Va may be applied to the photo pattern 130. When the third voltage Vc is applied to the photo pattern 130, a horizontal electric field is generated on a surface adjacent to the photo pattern 130. In an alternative exemplary embodiment, where the photo pattern 130 includes an organic compound, the third voltage Vc is not applied to the photo pattern 130, and the second voltage Vb may electrify the organic compound to generate a horizontal electrostatic force.

In an exemplary embodiment, a horizontal electric field ED is generated on a surface of the photo pattern 130, and the fine droplets 24, which are positively electrified, move in a direction substantially perpendicular to a direction of the horizontal electric field ED on the surface of the photo pattern 130 when the fine droplets 24 move from the nozzle NZ having positive polarity to the base substrate 110 having the negative polarity. In such an embodiment, a substantial portion of the fine droplets 24 may be focused toward the trench TC to substantially completely fill the trench TC. In such an embodiment, the size of the fine droplets 24 is small, and the fine droplets 24 are substantially uniformly filled in the trench TC.

In an alternative exemplary embodiment, the third voltage Vc may not be applied to the photo pattern 130. In such an embodiment, although the third voltage Vc is not applied to the photo pattern 130, the electric force of the second voltage Vb may generate an electrostatic force that focuses the fine droplets 24 toward the trench TC from the nozzle NZ.

Figure 1C:
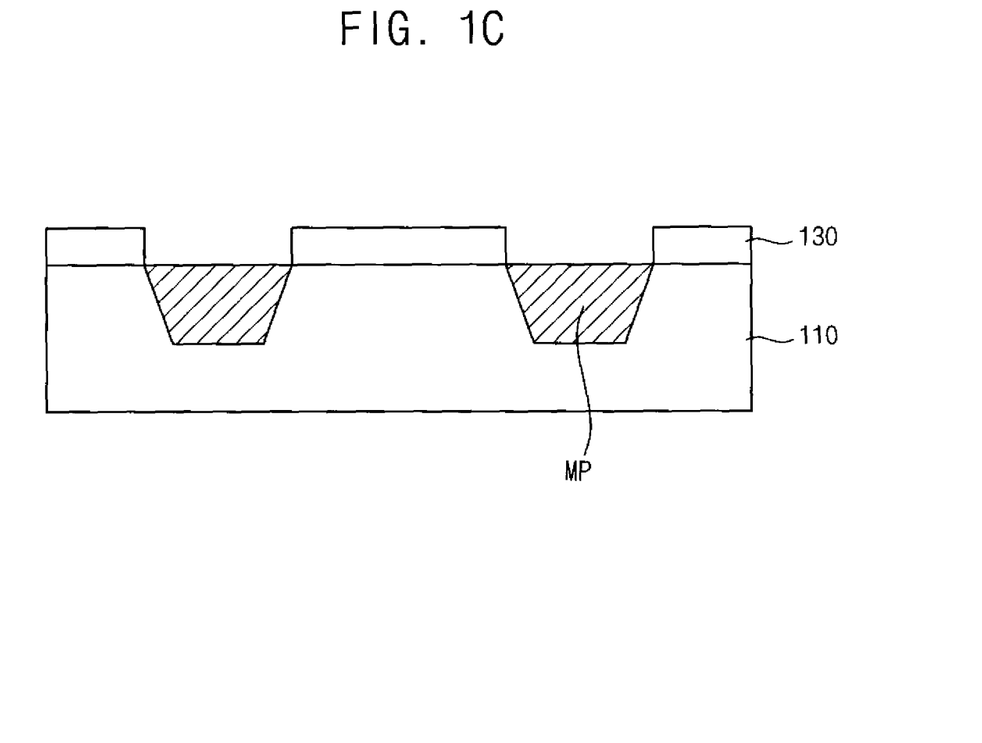

Referring to FIG. 1C, in an exemplary embodiment, the fine droplets 24 are filled in the trench TC, and the injecting solvent composing the fine droplets 24 substantially evaporates to leave conductive particles on the trench TC such that a conductive pattern MP is provided.

Figure 1D:
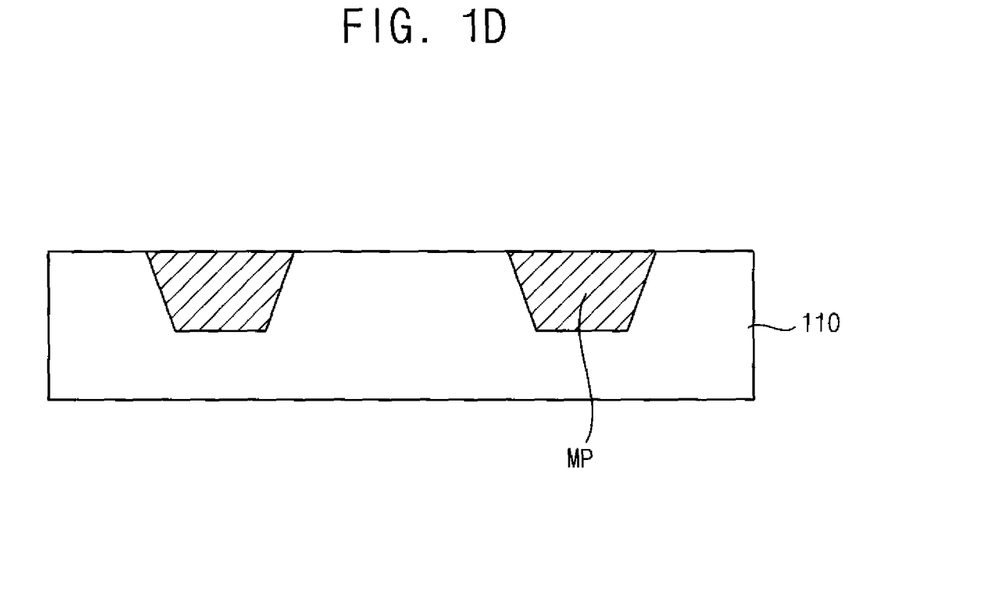

Referring to FIG. 1D, the photo pattern 130 is removed from the base substrate 110 on which the conductive pattern MP is disposed.

In an exemplary embodiment, amount of the fine droplets 24 that move to the photo pattern 130 is substantially small, and most of the fine droplets 24 that move to the photo pattern 130 do not remain on the photo pattern 130 because the fine droplets 24 evaporates due to the small size thereof. In an exemplary embodiment, when some amount of the fine droplets 24 remains on the photo pattern 130, the amount of the fine droplets 24 remaining on the base substrate 110 as impurities may be substantially reduced by the process of removing the photo pattern 130.

According to the exemplary embodiments described above, a conductive pattern MP may be provided by filling the fine droplets 24 in the trench TC when the conductive ink LQ is provided toward the trench TC on the base substrate 110 by the electrostatic injection method. In an exemplary embodiment, where the depth of the trench TC is greater than about 1 μm, the trench TC may be filled using the electrostatic injection method with improved manufacturing reliability of the conductive pattern MP. In an exemplary embodiment, the conductive pattern is used as a signal line, and the resistance of the signal line may be substantially reduced by increasing a thickness of the signal line with improved manufacturing reliability.

In an exemplary embodiment, the fine droplets 24 may be selectively provided for the trench TC of the base substrate 110 by the electrostatic injection method such that the conductive pattern MP may be provided without using an additional mask to fill the trench TC.

Figure 2A:
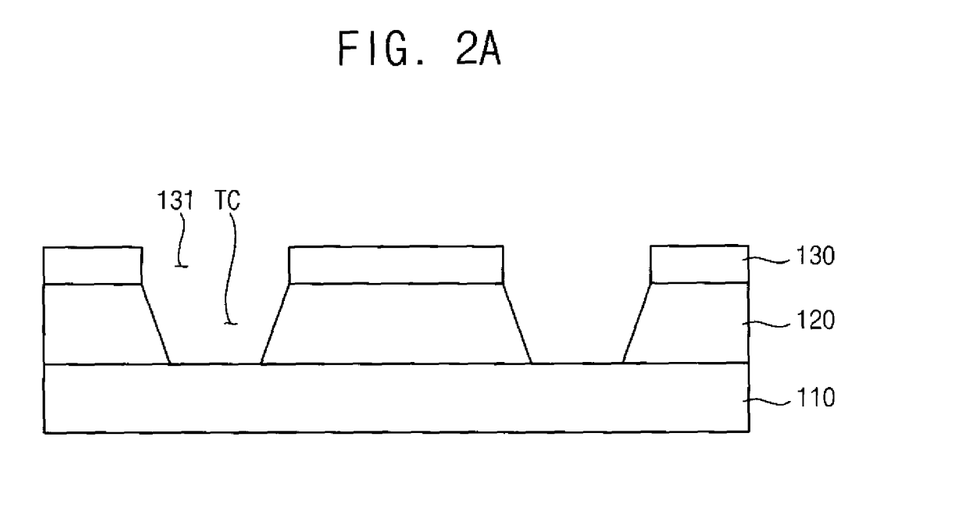
FIGS. 2A and 2B are cross-sectional views illustrating an alternative exemplary embodiment of a method of manufacturing a conductive pattern according to the invention.
Figure 2B:
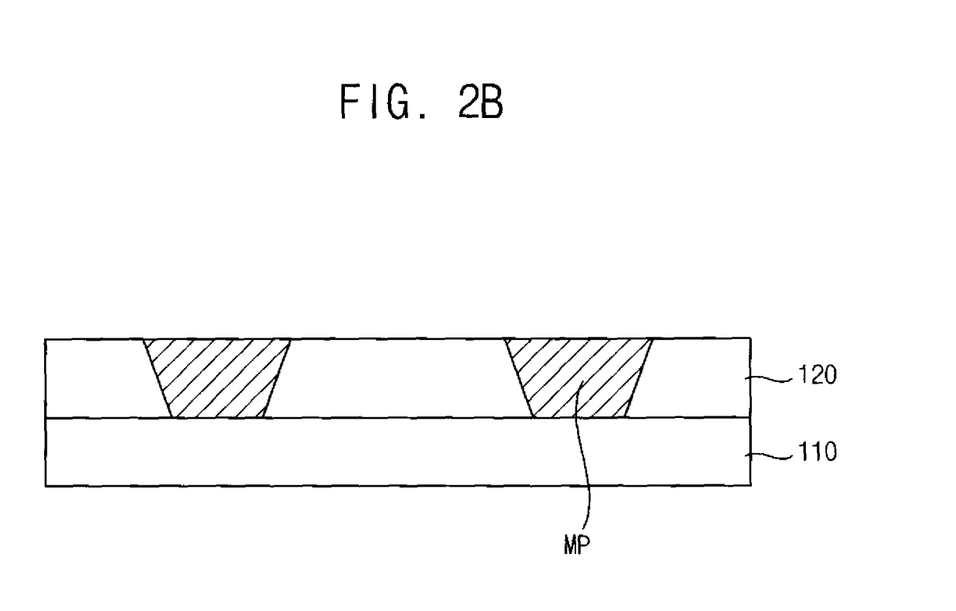

FIGS. 2A and 2B are cross-sectional views illustrating an alternative exemplary embodiment of a method of manufacturing a conductive pattern according to the invention.

Referring to FIG. 2A, an organic layer is provided on the base substrate 110, and a photo layer is provided on the organic layer. A photo pattern 130 is formed by exposing and developing the photo layer. The photo pattern 130 includes an opening 131 extending in a direction of the base substrate 110. The organic layer may be exposed by the opening 131.

In such an embodiment, an organic pattern 120 is formed by patterning the organic layer using the photo pattern 130 as an etch stopping layer. A trench TC is formed on the organic layer at an area corresponding to the opening 131 of the photo pattern 130. In an exemplary embodiment, the trench TC is defined by the organic pattern 120 disposed on the base substrate 110. A surface of the base substrate 110 is exposed by the trench TC.

Referring to FIGS. 1B and 2B, a conductive pattern MP is provided on the base substrate 110 on which the trench TC is defined. The conductive pattern MP may be provided by substantially the same processes illustrated in FIG. 1B. In an exemplary embodiment, the conductive pattern MP may be formed by applying a first voltage Va to the nozzle NZ and a second voltage Vb to the base substrate 110, and then injecting a conductive ink LQ using the electrostatic injection method to fill the trench TC with the fine droplets 24. The third voltage Vc may not be applied to the photo pattern 130. The process of filling the trench TC of the organic pattern 120 with the fine droplets 24 is substantially the same as the illustration of FIG. 1B, and any repetitive detailed descriptions thereof will be omitted.

In an exemplary embodiment, the photo pattern 130 is removed from the base substrate 110 on which the conductive pattern MP is formed.

According to the exemplary embodiment shown in FIGS. 2A and 2B, the conductive pattern MP may be formed on the trench TC of the organic pattern 120 on the base substrate 110 by the electrostatic injection method. In such an embodiment, the conductive pattern MP having an increased thickness may be provided with improved manufacturing reliability using a simple process with a reduced time.

Figure 3:
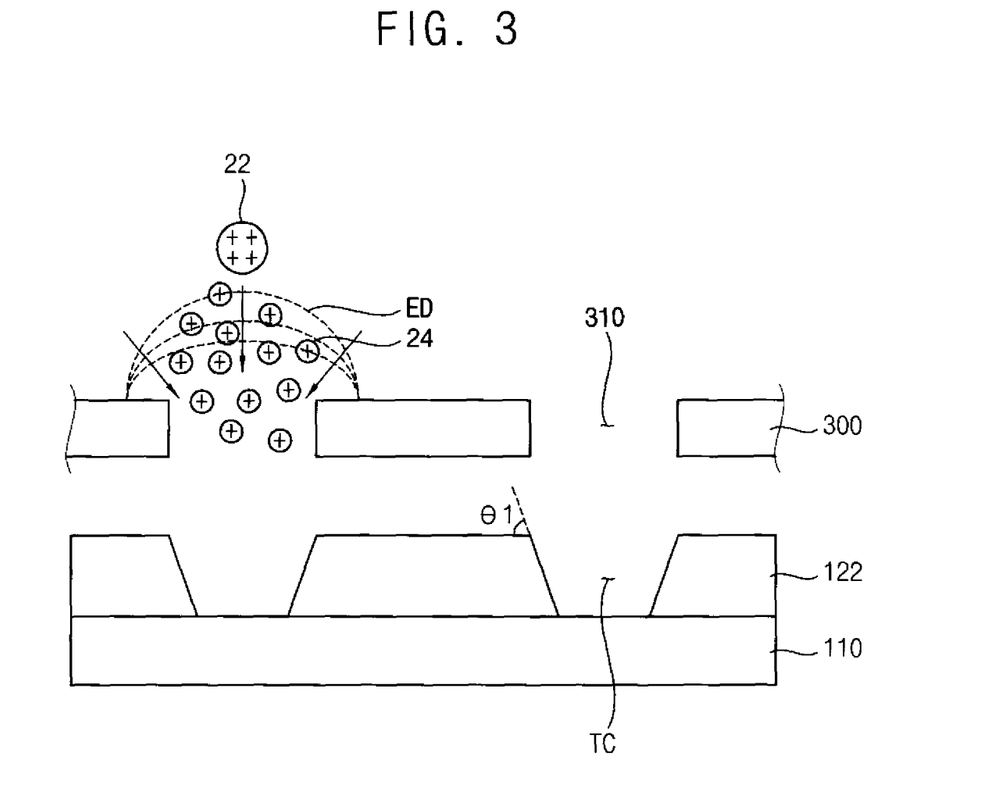
FIGS. 3 and 4 are cross-sectional views each illustrating another alternative exemplary embodiment of a method of manufacturing a conductive pattern according to the invention.
Figure 4:
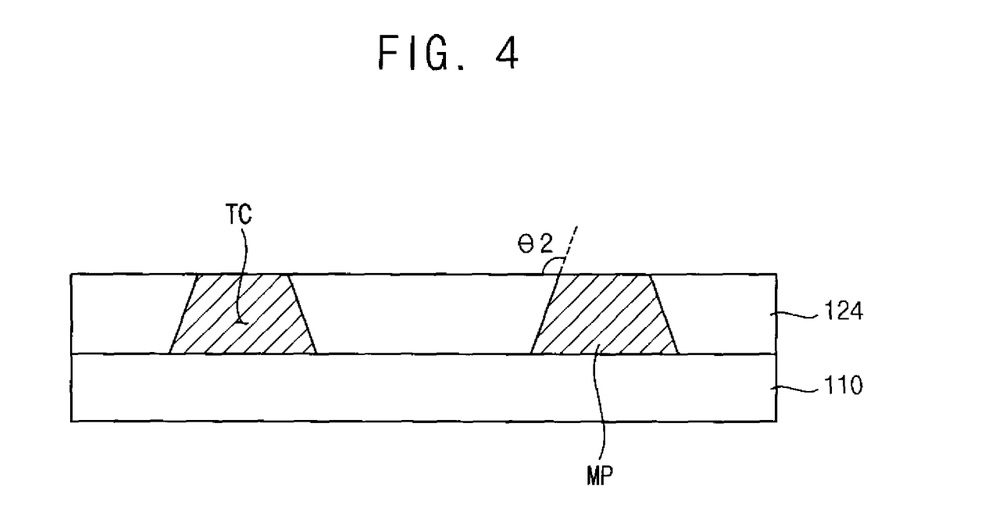

FIGS. 3 and 4 are cross-sectional views each illustrating another alternative exemplary embodiment of a method of manufacturing a conductive pattern according to the invention.

Referring to FIG. 3, an organic pattern 122 including a trench TC is disposed on a base substrate 110. In an exemplary embodiment, a mask 300 is disposed on the base substrate 110 on which the organic pattern 122 is disposed. The mask 300 includes an open pattern 310 disposed corresponding to the trench TC. In such an embodiment, fine droplets 24 are provided toward the trench TC on the base substrate 110 through the open pattern 310 of the mask 300.

In an exemplary embodiment, the organic pattern 122 may include positive type photoresist composition having photosensitivity. In such an embodiment, an organic layer may include the positive type photoresist composition, and then the photo pattern 122 may be formed by performing processes of light exposing and developing directly on the organic layer. In such an embodiment, where the photo pattern 122 includes positive type photoresist composition, a barrier wall of the organic pattern 122 may be tilted to a first angle θ1 defined by an acute angle of clockwise direction with respect to a surface of the base substrate 110 because the exposure area is removed by the developer.

In such an embodiment, the organic pattern 122 may be formed by sequentially forming an organic layer and a photo layer, patterning the photo layer to form a photo pattern 130, and then patterning the organic layer using the photo pattern 130. In such an embodiment, the organic layer may be light-insensitive composition.

In an exemplary embodiment, using the mask 300 in FIG. 3, a first voltage Va and a second voltage Vb are applied to the nozzle NZ and the base substrate 110, respectively, to form an electric field between the nozzle NZ and the base substrate 110. In such an embodiment, a third voltage Vc having the same polarity as the first voltage Va may be applied to the mask 300 to focus the fine droplets 24 being injected toward the trench TC such that a conductive pattern is formed on the trench TC.

In an exemplary embodiment, the mask 300 may be reused in another process, and the conductive pattern may be manufactured without forming an additional photo pattern on the organic pattern 122.

Hereinafter, another alternative exemplary embodiment of a method of manufacturing a conductive pattern will be described in greater detail referring to FIG. 4.

Referring to FIG. 4, an organic pattern 124 having a trench TC is disposed on a base substrate 110, and a conductive pattern MP is formed on the trench TC.

In an exemplary embodiment, the organic pattern 124 may include negative type photoresist composition. In such an embodiment, an organic layer is formed using the negative type photoresist composition, and then an organic pattern 124 is formed by exposing and developing the organic layer. In such an embodiment, where the organic pattern 124 includes the negative type photoresist composition, a barrier wall of the organic pattern 124 may be tilted to a second angle θ2 defined by an obtuse angle clockwise with respect to a surface of the base substrate 110 because the exposure area remains after the photoreaction.

The conductive pattern MP may be formed by electrostatically injecting the fine droplets 24 on the trench TC using the mask 300 illustrated in FIG. 3. The trench TC may be filled enough with the fine droplets 24 because the size of the fine droplets 24 is substantially small although the barrier wall of the organic pattern 124 is tilted as a reverse tapered shape such that the trench TC has a trapezoidal shape when viewed cross-sectionally.

In such an embodiment, an organic layer and a photo layer may be formed sequentially, and then a photo pattern may be formed by patterning the photo layer. An organic pattern 124 including a trench TC having a trapezoidal shape when viewed cross-sectionally may be formed using the photo pattern as a mask, and a conductive pattern MP may be formed by electrostatically injecting the fine droplets 24 on the trench TC. In such an embodiment, the organic layer and the photo pattern 124 may include light-insensitive composition.

In such an embodiment, the photo pattern may be removed after forming the conductive pattern MP.

Figure 5:
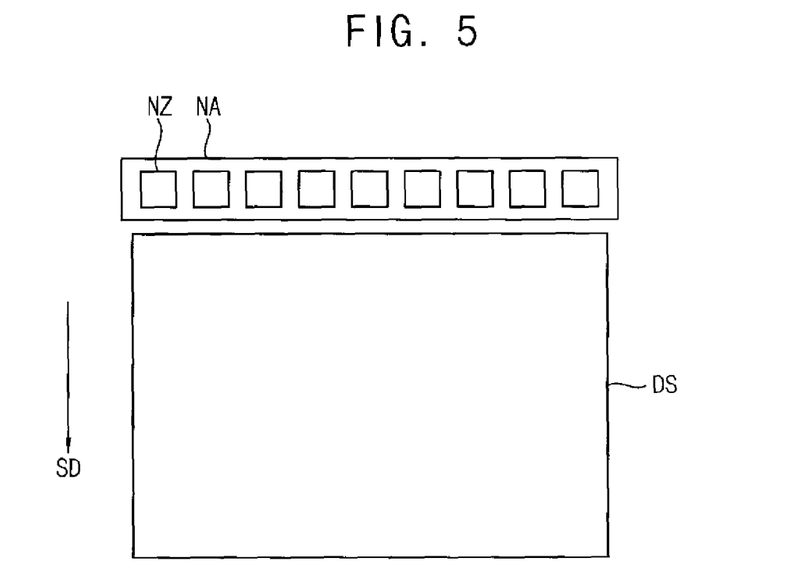
FIG. 5 is a block diagram illustrating an exemplary embodiment of a method of manufacturing a conductive pattern using multi-nozzles.

FIG. 5 is a block diagram illustrating an exemplary embodiment of a method of manufacturing a conductive pattern using multi-nozzles.

Referring to FIG. 5, a conductive pattern MP may be provided on a display substrate DS using an assembly NA including a plurality of nozzles NZ using an electrostatic injection method. While a first voltage Va is applied to the assembly NA and a second voltage Vb is applied to the base substrate 110, the conductive pattern MP, as shown in FIG. 1D, may be provided by moving the assembly NA in a scan direction SD and injecting the conductive ink LQ. In such an embodiment, a third voltage Vc may be applied to the photo pattern 130 additionally.

In such an embodiment, the conductive pattern MP may be formed over a wide area during a relatively short time by using the assembly NA illustrated in FIG. 5 than using an injecting apparatus including a single nozzle.

Hereinafter, an exemplary embodiment of a method of manufacturing a display substrate using the method of forming the conductive patterns illustrated in FIGS. 1A to 4 will be described in detail with reference to FIGS. 6 to 12.

Figure 6:
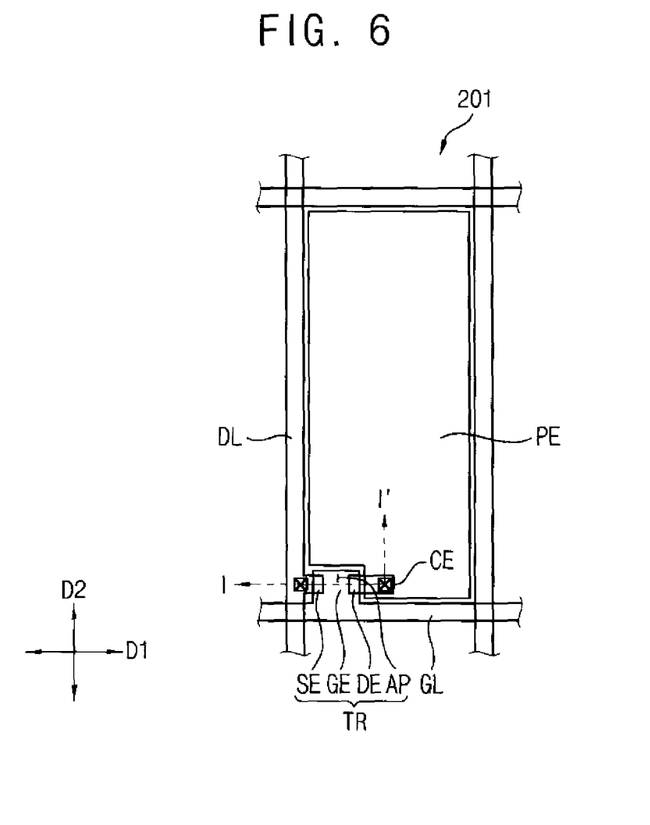
FIG. 6 is a plan view of an exemplary embodiment of a display substrate according to the invention.
Figure 7:
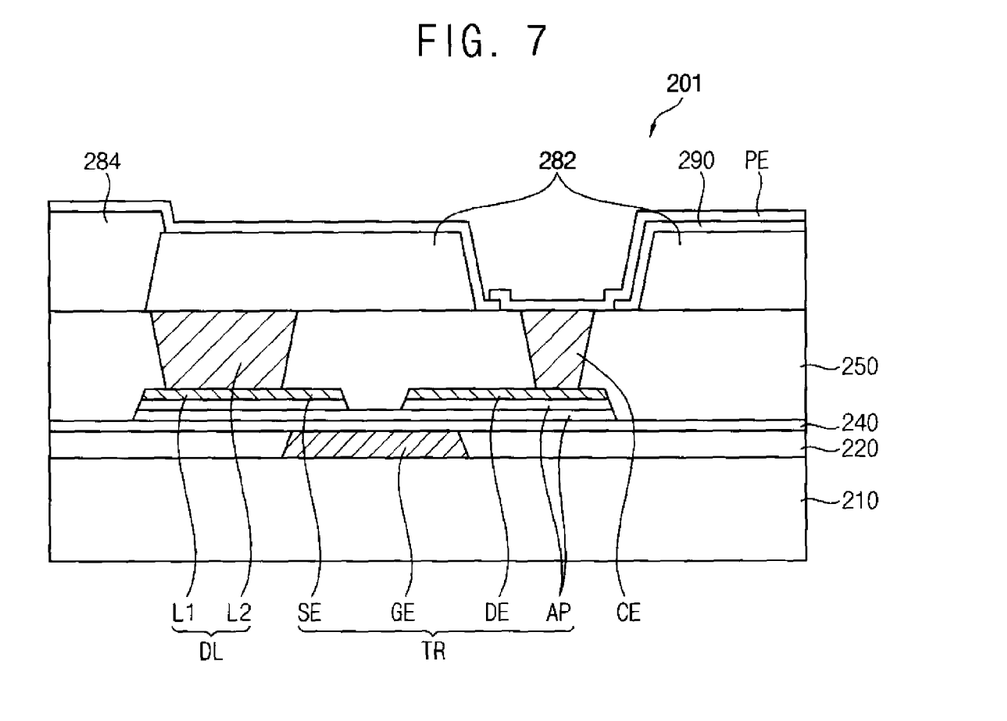
FIG. 7 is a cross-sectional view taken along line I-I' of FIG. 6.

FIG. 6 is a plan view of an exemplary embodiment of a display substrate according to the invention, and FIG. 7 is a cross-sectional view taken along line I-I' of FIG. 6.

Referring to FIGS. 6 and 7, a display substrate 201 includes a gate line GL, a gate planarization layer 220, a gate insulation layer 240, a data line DL, a switching element TR, an organic layer 250, color filters 282, a passivation layer 290, a contact electrode CE and a pixel electrode PE.

The gate line GL is a first signal line of the display substrate 201 and extends in a first direction D1 of a base substrate 210. The gate line GL is integrally provided with a gate electrode GE of the switching element TR on the base substrate 210. The base substrate 210, on which the gate line GL and the gate electrode GE are disposed, may be planarized by the gate planarization layer 220. In such an embodiment, the height of the gate planarization layer 220 may be substantially the same as a height of each of the gate line GL and the gate electrode GE, and the plane, on which the gate line GL, the gate electrode GE and the gate planarization layer 220 are disposed, may be substantially parallel to an upper surface of the base substrate 210.

The gate insulation layer 240 may be disposed on the gate line GL, the gate electrode GE and the gate planarization layer 220. The gate insulation layer 240 may insulate the gate electrode GE from a semiconductor pattern AP of the switching element TR.

The semiconductor pattern AP may include a semiconductor layer and an ohmic contact layer disposed on the semiconductor layer. In an exemplary embodiment, the semiconductor layer may include amorphous silicon. In an alternative exemplary embodiment, the semiconductor layer may include metal oxide, and the ohmic contact layer may be omitted.

The data line DL extends in a second direction D2 crossing the first direction D1 to cross the gate line GL. The data line DL includes a first conductive pattern L1 and a second conductive pattern D2 disposed on the first conductive pattern L1.

The second conductive pattern L2 is a pattern which is filled in the trench 252 (refer to FIG. 8B) of the organic layer 250 having a thickness, and the second conductive pattern L2 functions as a second signal line of the display substrate.

The first conductive pattern L1 is a third signal line provided under the second conductive pattern L2 to directly contact the semiconductor pattern AP in substantially the same process as the process for providing the semiconductor pattern AP. The second conductive pattern L2 is provided to overlap the first conductive pattern L1 in an area on which the first conductive pattern L1 is disposed. The second conductive pattern L2 may be provided in an area on which the first conductive pattern L1 is disposed. In such an embodiment, the first conductive pattern L1 may be formed using a conventional sputtering or vapor depositioning, and a thickness of the first conductive pattern L1 is less than the thickness of the second conductive pattern L2.

The organic layer 250 may have thickness of about 1 μm or more. The height of the second conductive pattern L2 may be substantially the same as the depth of the trench 252 and the thickness of the organic layer 250. In such an embodiment, the thickness of the data line DL becomes substantially thick by the thickness of the second conductive pattern L2.

A source electrode SE of the switching element TR is connected to the first conductive pattern L1, and provided integrally with the first conductive pattern L1. The source electrode SE overlaps the semiconductor pattern AP, and connected to the second conductive pattern L2 by the first conductive pattern L1. In an exemplary embodiment, the source electrode SE is connected to the data line DL.

A drain electrode DE of the switching element TR is disposed on the semiconductor pattern AP spaced apart from the source electrode SE. Each of the source electrode SE and the drain electrode DE may be provided on the semiconductor pattern AP using substantially the same mask as the mask, which is used to form the semiconductor pattern AP.

The contact electrode CE is filled in a hole 253 (refer to FIG. 8B) that penetrates the area on which the drain electrode DE is disposed, and directly contacts the drain electrode DE. The contact electrode CE may be provided on the drain electrode DE in a process of providing the second conductive pattern L2. In an exemplary embodiment, the drain electrode DE may be connected to the pixel electrode PE on the surface of the organic layer 250 by the contact electrode CE. The thickness of the contact electrode CE may be substantially the same as the thickness of the second conductive pattern L2.

The color filters may include a first color filter 282 disposed on a pixel area corresponding to the pixel electrode PE and a second color filter 284 disposed on another pixel area adjacent to the pixel area. The boundary between the first color filter 282 and the second color filter 284 may correspond to an area on which the data line DL is disposed. The first color filter 282 may include a first hole that partially exposes an area on which the contact electrode CE is disposed.

The passivation layer 290 may be disposed on the base substrate 210 on which the color filters 282 and 284 are provided, to prevent gases or impurities from flowing into a liquid crystal layer (not shown) which is disposed on the color filters 282 and 284. The passivation layer 290 may include a second hole corresponding to the first hole and exposing the contact electrode CE.

The pixel electrode PE is in direct contact with the contact electrode CE by the first hole and the second hole. The pixel electrode PE may be in contact with the contact electrode CE to connect the pixel electrode PE to the switching element TR.

Figure 8A:
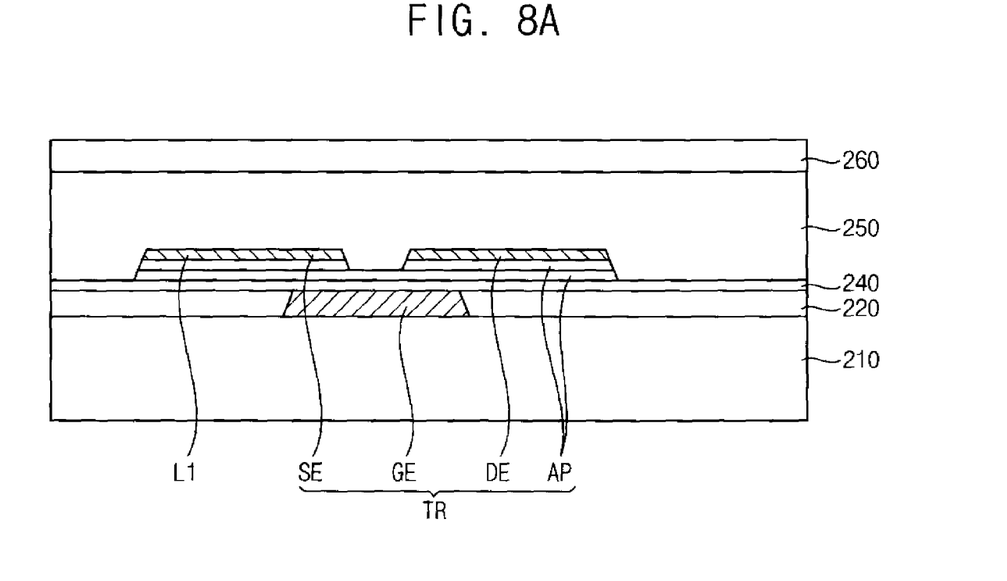
FIGS. 8A and 8B are cross-sectional views illustrating an exemplary embodiment of a method of manufacturing the display substrate of FIG. 7.
Figure 8B:
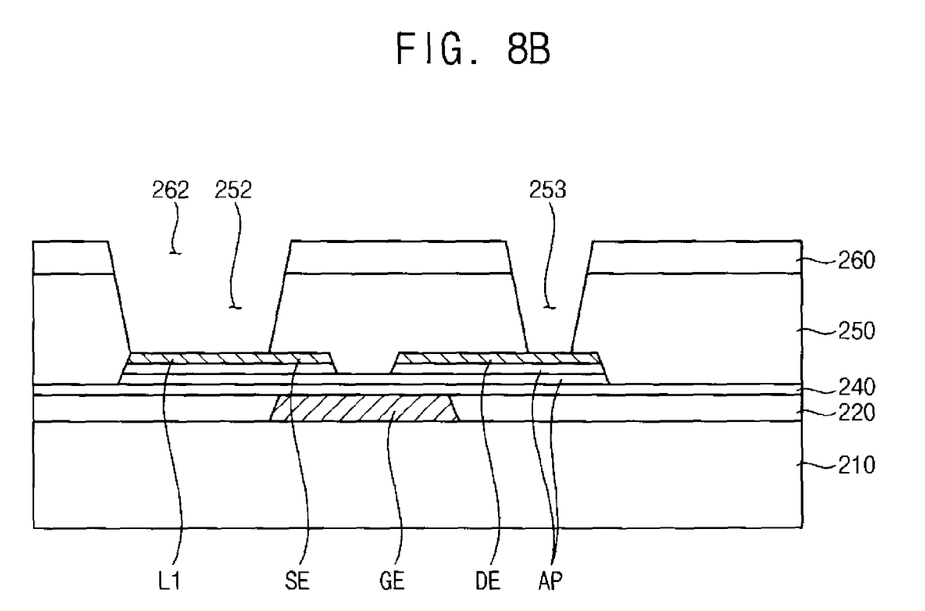

FIGS. 8A and 8B are cross-sectional views illustrating an exemplary embodiment of a method of manufacturing of the display substrate of FIG. 7.

Referring to FIGS. 6, 7 and 8A, the gate line GL and the gate electrode GE are disposed on the base substrate 210, and then the gate planarization layer 220 is provided. When the gate line GL and the gate electrode GE are formed to have thickness of about 1 μm or more, patterns formed in a subsequent process on the base substrate 210, on which the gate line GL and the gate electrode GE are disposed, may be shorted. In an exemplary embodiment, the gate line GL and the gate electrode GE are planarized by the gate planarization layer 220 to improve manufacturing reliability of the patterns which are formed in the subsequent process.

Then, the gate insulation layer 240 is provided on the base substrate 210 on which the gate line GL, the gate electrode GE and the gate planarization layer 220 are disposed. The semiconductor layer, the ohmic contact layer and a data metal layer are sequentially provided on the gate planarization layer 220. And then, the semiconductor pattern AP, the source electrode SE, the drain electrode DE and the first conductive pattern L1 are provided by patterning sequentially provided layers using a mask including a diffractive part or a transreflective part.

The organic layer 250 and a photo layer 260 are sequentially provided on the base substrate 210 on which the source electrode SE, the drain electrode DE and the first conductive pattern L1 are disposed. In one exemplary embodiment, for example, the organic layer 250 may include light-insensitive composition, and the photo layer 260 may include negative type photoresist composition.

Referring to FIG. 8B, a photo pattern 260 is formed by exposing and developing the photo layer 260. The photo pattern 260 partially exposes the organic layer 250, and includes an opening 262 corresponding to an area, on which the first conductive pattern L1 is provided.

The trench 252 is formed on the organic layer 250 by patterning the organic layer 250 using the photo pattern 260 as an etch stopping layer. In an exemplary embodiment, each of the source electrode SE and the first conductive pattern L1 is partially exposed by the trench 252. In such an embodiment, the hole 253 partially exposing the drain electrode DE is provided in the process of forming the trench 252.

The second conductive pattern L2 and the contact electrode CE are provided by charging the conductive ink LQ (see FIG. 1B) on the trench 252 and the hole 253 using the electrostatic injection method illustrated in FIG. 1B. Referring again to FIG. 8B and back to FIG. 1B, the conductive ink LQ is injected to the trench 252 and the hole 253 while a first voltage Va and a second voltage Vb are applied to the nozzle NZ that injects the conductive ink LQ and the base substrate 210, respectively, to generate an electric field between the nozzle NZ and the base substrate 210. In such an embodiment, fine droplets 24 may be formed by the first voltage Va and the second voltage Vb, and be selectively injected to the trench 252 and the hole 253. In an exemplary embodiment, a third voltage Vc having the same polarity as the first voltage Va may be applied to the photo pattern 260. Any repetitive detailed description of the elements shown in FIG. 1B is omitted.

After the second conductive pattern L2 and the contact electrode CE are provided, the photo pattern 260 is removed.

The first and the second color filters 282 and 284, the passivation layer 290 and the pixel electrode PE may be sequentially provided on the base substrate 210, on which the photo pattern 260 is removed, to manufacture the display substrate 201 illustrated in FIGS. 6 and 7.

According to the description above, the thickness of the signal line may be substantially increased by including the second conductive pattern L2 which the data line DL is as thick as the organic layer 250. The increase in the thickness of the signal line may lead to lower the resistance of the signal line, to solve problems such as RC delay, etc.

Figure 9:
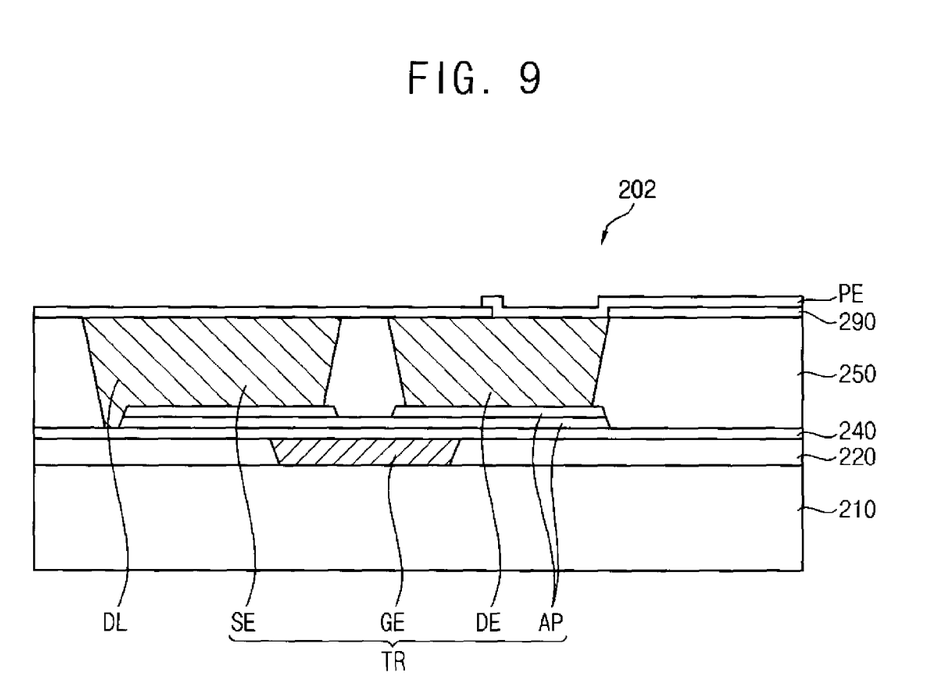
FIG. 9 is a cross-sectional view of an alternative exemplary embodiment of a display substrate according to the invention.

FIG. 9 is a cross-sectional view of an alternative exemplary embodiment of a display substrate according to the invention.

Referring to FIG. 9, the display substrate 202 includes a gate line GL, a gate planarization layer 220, a gate insulation layer 240, a data line DL, a switching element TR, an organic layer 250, a passivation layer 290 and a pixel electrode PE.

The gate line GL is a first signal line of the display substrate 202, and is provided integrally with a gate electrode GE of the switching element. The base substrate 210, on which the gate line GL and the gate electrode GE are disposed, may be planarized by the gate planarization layer 220. In an exemplary embodiment, the height of each of the gate line GL and the gate electrode GE may be substantially the same as the height of the gate planarization layer 220. A plane collectively defined by the gate line GL, the gate electrode GE and the gate planarization layer 220 may be substantially parallel to a surface of the base substrate 210. The gate electrode GE may have reverse-trapezoidal shape when viewed cross-sectionally.

The gate insulation layer 240 may be disposed on the gate line GL, the gate electrode GE and the gate planarization layer 220 to insulate the gate electrode GE from a semiconductor pattern AP of the switching element TR. The semiconductor pattern AP may include a semiconductor layer and an ohmic contact layer disposed on the semiconductor layer.

The data line DL is disposed crossing the gate line GL. The data line DL is a pattern which is filled in a trench 254 (see FIG. 10) of the organic layer 250 with a thickness, and functions as a second signal line of the display substrate 202 with the first signal line.

A source electrode SE of the switching element TR is connected to the data line DL and is provided integrally with the data line DL. The source electrode SE may be disposed on the trench 254 or a hole connected to the trench 254. A drain electrode DE of the switching element TR is spaced apart from the source electrode SE, and is filled in the hole 255 (see FIG. 10) of the organic layer 250 having a thickness.

The organic layer 250 may have a thickness of about 1 nm or more. The height of each of the data line DL, the source electrode SE and the drain electrode DE may substantially the same as the depth of the hole 255 and the trench 254 on the organic layer 250 and the thickness of the organic layer 250.

The passivation layer 290 is disposed on the base substrate 210 on which the data line DL, the source electrode SE, the drain electrode DE and the organic layer 250 are disposed. The passivation layer 290 may include a contact hole corresponding to the hole 255 of the organic layer 250.

The pixel electrode PE may be in direct contact with the drain electrode DE by the contact hole such that the pixel electrode PE is connected to the switching element.

Figure 10:
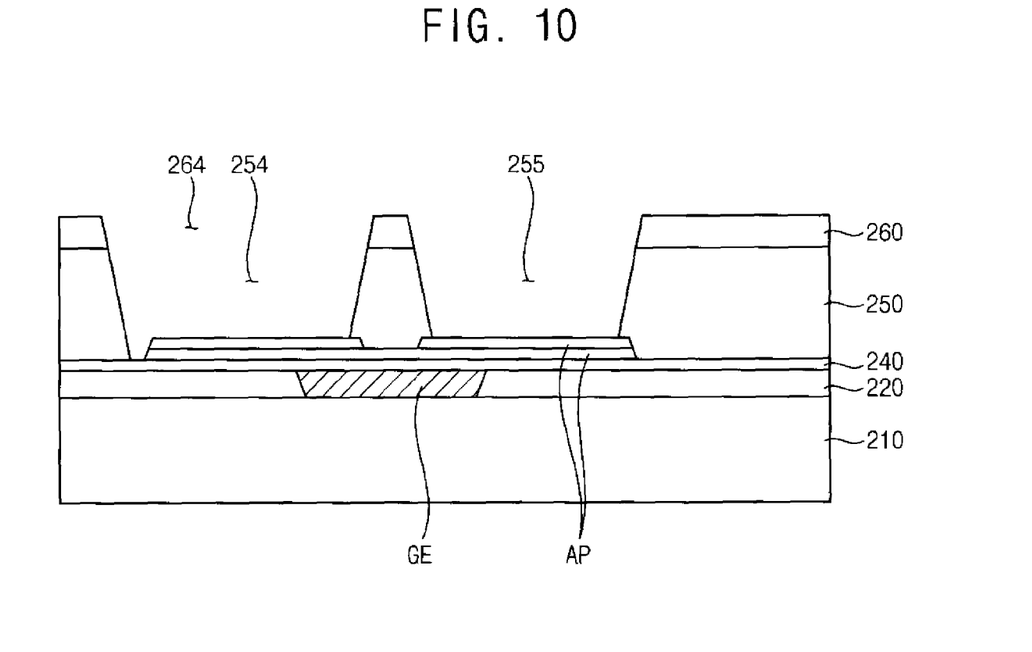
FIG. 10 is a cross-sectional view illustrating an exemplary embodiment of a method of manufacturing of the display substrate of FIG. 9.

FIG. 10 is a cross-sectional view illustrating an exemplary embodiment of the method of manufacturing of the display substrate of FIG. 9.

Referring to FIGS. 9 and 10, a trench is formed in an area, on which the gate line GL and the gate electrode GE are provided, by forming the gate planarization layer 220 on the base substrate 210 and patterning the gate planarization layer 220. A barrier wall of the trench formed on the gate planarization layer 220 may be tilted to an acute angle clockwise with respect to a surface of the base substrate 210.

In an exemplary embodiment, a photo pattern (not shown) may be provided on the gate planarization layer 220 to pattern the gate planarization layer 220. A conductive ink LQ is provided to the trench on the gate planarization layer 220 while a first voltage Va is applied to the nozzle NZ injecting the conductive ink LQ and a second voltage Vb is applied to the base substrate 210 as illustrated in FIG. 1B. The conductive ink LQ may be dispersed into fine droplets 24 by an electric field generated by the first voltage Va and the second voltage Vb. In such an embodiment, the conductive ink LQ may be selectively injected to the trench by a horizontal electric field generated on a surface of the photo pattern, where a third voltage Vc is applied to the photo pattern. The intensity of the horizontal electric field may be increased by the third voltage Vc. In an exemplary embodiment, the gate line GL and the gate electrode GE are formed by filling the conductive ink LQ in the trench. Then, the photo pattern is removed.

In an exemplary embodiment, after the forming the gate planarization layer 220 by coating, exposing and developing the gate planarization layer 220 using positive type photoresist composition, the gate line GL and the gate electrode GE may be provided while the third voltage Vc is applied to the gate planarization layer 220 without using the photo pattern. In an alternative exemplary embodiment, a horizontal electric field may be generated on a surface of the gate planarization layer 220 by an electric force arising from the second voltage Vb and by the feature of the positive type photoresist composition.

In an alternative exemplary embodiment, a barrier wall of the gate planarization layer 220 may be tilted to an obtuse angle clockwise with respect to a surface of the base substrate 210.

In an exemplary embodiment, the gate insulation layer 240 and the semiconductor pattern AP is sequentially provided on the base substrate 210, on which the gate line GL, the gate electrode GE and the gate planarization layer 220 are disposed.

The organic layer 250 is provided on the base substrate 210 on which the semiconductor pattern AP is disposed. The thickness of the organic layer 250 may be greater than about 1 nm. A photo layer is provided on the organic layer 250, and a photo pattern including an opening 264 is formed by exposing and developing the photo layer. The opening 264 is defined in an area corresponding to the data line DL, the source electrode SE and the drain electrode DE.

A trench 254 and a hole 255 are formed on the organic layer 250 by patterning the organic layer 250 using the photo pattern 260 as an etch stopping layer. The semiconductor pattern AP is partially exposed by the trench 254 and the hole 255.

Then, a conductive ink is injected to the trench 254 and the hole 255 while the first voltage Va is applied to the nozzle NZ and the second voltage Vb is applied to the base substrate 210. In an exemplary embodiment, the third voltage Vc may be applied to the photo pattern 260. In an exemplary embodiment, the data line DL, the source electrode SE and the drain electrode DE are provided as described above.

The photo pattern 260 is removed after the data line DL, the source electrode SE and the drain electrode DE are provided.

The passivation layer 290 and the pixel electrode PE are provided on the base substrate 210 on which the organic layer 250, the data line DL, the source electrode SE and the drain electrode DE are disposed. Accordingly, the display substrate 202 illustrated in FIG. 9 may be manufactured.

In an exemplary embodiment, as described above, the gate line GL and the gate electrode GE may be provided by the electrostatic injection method using the trench of the gate planarization layer 220. In such an embodiment, the data line DL may be provided to have a predetermined thickness and processes may be simplified because the source electrode SE and the drain electrode DE may be simultaneously provided in the process of providing the data line DL by the electrostatic injection method such that manufacturing reliability and productivity are substantially improved.

Figure 11:
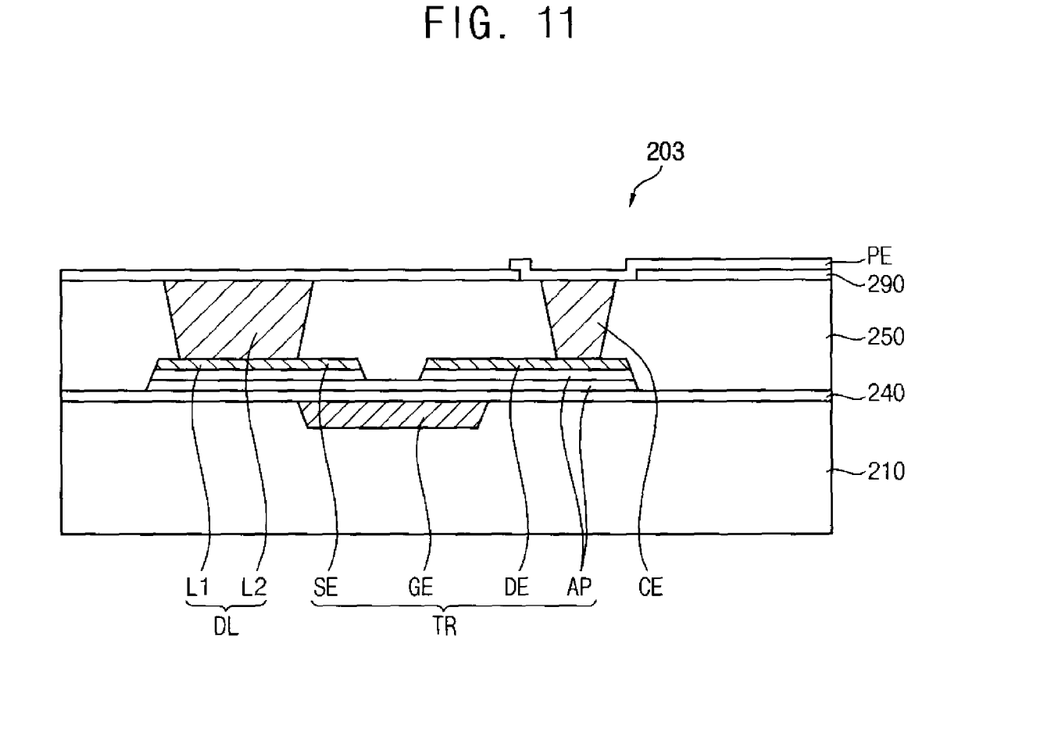
FIG. 11 is a cross-sectional view of another alternative exemplary embodiment of a display substrate according to the invention.

FIG. 11 is a cross-sectional view of another alternative exemplary embodiment of a display substrate according to the invention.

Referring to FIG. 11 and back to FIG. 6, the display substrate 203 includes a gate line GL, a gate insulation layer 240, a data line DL, a switching element TR, an organic layer 250, a passivation layer 290, a contact electrode CE and a pixel electrode PE. In an alternative exemplary embodiment, color filters (illustrated in FIG. 7) may be disposed between the passivation layer 290 and the pixel electrode PE.

The gate line GL is provided in a trench defined on a base substrate 210 as a first signal line of the display substrate. The gate line GL is integrally provided with a gate electrode GE of the switching element TR. Height of each of the gate line GL and the gate electrode GE may be substantially the same as the height of the trench, and the gate line GL and the gate electrode GE may collectively define a plane with a surface of the base substrate 210. In an exemplary embodiment, the shape of the cross-section of the gate line GL and the gate electrode GE may be reverse-trapezoidal. In an alternative exemplary embodiment, the shape of the cross-section of the gate line GL and the gate electrode GE may be trapezoidal or rectangular, which is corresponding to the shape of the cross-section of the trench.

The gate insulation layer 240 may be disposed on the base substrate 210 on which the gate line GL and the gate electrode GE are disposed and insulate the gate electrode GE from a semiconductor pattern AP of the switching element TR.

In such an embodiment, the data line DL, the switching element TR, the organic layer 250, the passivation layer 290, the contact electrode CE and the pixel electrode PE which are formed on the gate insulation layer 240 are substantially the same as illustrated in FIGS. 6 and 7, and any repetitive detailed description thereof is omitted.

Figure 12:
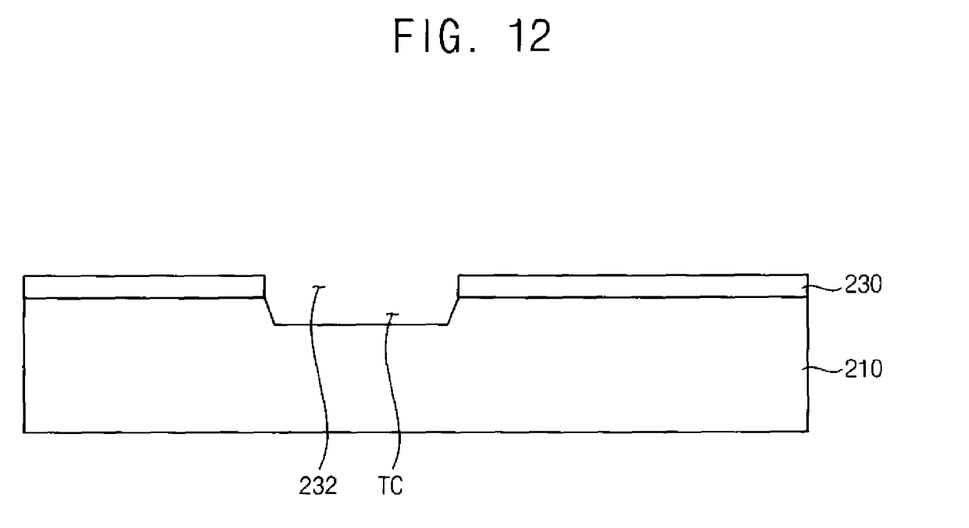
FIG. 12 is a cross-sectional view illustrating an exemplary embodiment of a method of manufacturing the display substrate of FIG. 11.

FIG. 12 is a cross-sectional view illustrating an exemplary embodiment of the method of manufacturing the display substrate of FIG. 11.

Referring to FIG. 12, a photo pattern 230 having an opening 232 is disposed on the base substrate 210. In an exemplary embodiment, the photo pattern 230 may include, for example, negative type photoresist composition. A surface of the base substrate 210 may be exposed by the photo pattern 230.

Then, a trench TC is formed on the base substrate 210 by etching the base substrate 210 using the photo pattern 230 as an etch stopping layer. The trench TC may be formed corresponding to an area on which the gate line GL and the gate electrode GE.

After the trench TC is formed, voltages are applied to a nozzle that injects a conductive ink, the base substrate 210 and the photo pattern 230, respectively, and the conductive ink is injected to the trench TC by substantially the same process as illustrated in FIG. 1B such that the gate line GL and the gate electrode GE may be provided on the trench TC.

After the gate line GL and the gate electrode GE are provided, the photo pattern 230 is removed from the base substrate 210.

The gate insulation layer 240, the semiconductor pattern AP, the source electrode SE of the switching element TR, the drain electrode DE, and a first conductive pattern L1 are provided on the base substrate 210 on which the gate line GL and the gate electrode GE are disposed. In an alternative exemplary embodiment, the first conductive pattern L1 may be omitted.

The organic layer 250 is provided on the base substrate on which the first conductive pattern L1 is disposed, and a second conductive pattern L2 is provided on the trench of the organic layer 250. In such an embodiment, the contact electrode CE is provided in a hole which is formed on the organic layer 250 to be in contact with the drain electrode DE. Accordingly, the data line DL including the first and the second conductive pattern L1 and L2 may be provided. In such an embodiment, the process of forming the second conductive pattern L2 is substantially the same as the process illustrated in FIGS. 8A and 8B, and any repetitive detailed description of the process is omitted.

After the data line DL and the contact electrode CE are provided, the passivation layer 290 and the pixel electrode PE are sequentially provided. Accordingly, the display substrate 203 may be manufactured illustrated in FIG. 11.

In an exemplary embodiment, as described above, the gate line GL and the gate electrode GE having substantially large thickness are provided in the trench which is directly formed on the base substrate 210 such that a subsequent process may be less influenced by the thickness of the gate line GL. In such an embodiment, a thick gate line GL may be effectively provided using the electrostatic injection method in the process of providing the gate line GL such that manufacturing reliability of the gate line GL is substantially improved, and the resistance of the gate line GL is substantially lowered.

In the exemplary embodiments shown in FIGS. 7, 8A, 8B and 9 through 12, processes of providing signal lines or electrodes are performed using the photo patterns 230 and 260. In an alternative exemplary embodiment, the signal lines or electrodes may be provided by processes using the mask 300 as illustrated in FIGS. 3 and 4.

In an exemplary embodiment, a conductive pattern may be efficiently formed on the trench of the organic layer 250 by forming the organic layer 250 of photosensitive composition without using the additional mask 300 by electrostatic forces of the first and the second voltages Va and Vb applied to the nozzle NZ and the base substrate 210 or by an electric force of the third voltage Vc.

According to exemplary embodiments as described herein, a conductive pattern may be effectively provided in a trench formed on a substrate using fine droplets having a size of about 100 nm or less by an electrostatic injection method. In an exemplary embodiment, the depth of the trench is deeper than about 1 μm, and the trench may be effectively and substantially filled by the electrostatic injection method such that manufacturing reliability of the conductive pattern is substantially improved. In an exemplary embodiment, RC delay is substantially reduced or effectively prevented because the resistance of the conductive pattern is decreased by increasing the thickness of the conductive pattern.

In an exemplary embodiment, by applying a voltage to an independent mask or a photo pattern which functions as a mask during the process of electrostatic injection, the fine droplets may be selectively filled in the trench to improve manufacturing reliability of the conductive pattern.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a display substrate, the method comprising:
    forming a second signal line and a gate electrode and then providing a semiconductor pattern on a substrate, wherein the gate electrode is connected to the second signal line, and the semiconductor pattern overlaps the gate electrode;
    providing a source electrode and a drain electrode on the substrate on which the semiconductor pattern provided, wherein each of the source electrode and the drain electrode overlap the semiconductor pattern;
    forming a trench on the substrate;
    forming a first signal line by providing the trench with a conductive ink while an electric field is generated between the substrate and a nozzle, wherein the nozzle ejects the conductive ink,
    wherein the second signal line crosses the first signal line; and
    providing a pixel electrode on the substrate on which the first signal line and the second signal line are provided,
    wherein the electric field is generated by applying different voltages to the substrate and the nozzle, respectively, and
    wherein the forming the trench on the substrate comprises:
        providing an organic layer on the substrate, on which the source electrode and the drain electrode are provided; and
        forming the trench and a hole on the organic layer by patterning the organic layer, wherein the trench exposes the source electrode and the hole exposes the drain electrode.

2. The method of claim 1, wherein the providing the drain electrode comprising:
    providing a third signal line integrally connected to the source electrode and disposed in an area corresponding to the first signal line.

3. The method of claim 1, wherein
    the organic layer is patterned using a photo pattern as an etch stopping layer,
    the photo pattern is disposed on the organic layer, and
    the first signal line is formed while voltages having different polarities are applied to the substrate and the nozzle, respectively.

4. The method of claim 1, further comprising:
    before the forming the trench on the substrate, forming the second signal line and a gate electrode on the substrate and then providing a semiconductor pattern on the substrate,
    wherein the gate electrode is connected to the second signal line and overlapping the semiconductor pattern, and wherein the forming the first signal line comprises: providing a source electrode connected to the first signal line and a drain electrode spaced apart from the source electrode.

5. The method of claim 1, wherein the forming the trench on the substrate comprising:
providing a photo pattern on the substrate; and
etching the substrate using the photo pattern as an etch stopping layer, and
wherein the photo pattern is removed after the first signal line is formed on the substrate on which the photo pattern is provided.

6. The method of claim 1, wherein the forming the trench on the substrate comprising:
providing an organic layer on the substrate;
patterning a photo pattern on the organic layer; and
etching the organic layer using the photo pattern as an etch stopping layer; and
wherein the photo pattern is removed after the first signal line is formed on the substrate on which the photo pattern is provided.

7. A method of manufacturing a display substrate, the method comprising:
forming a trench on a substrate;
forming a first signal line by providing the trench with a conductive ink while an electric field is generated between the substrate and a nozzle, wherein the nozzle ejects the conductive ink;
forming a second signal line on the substrate, wherein the second signal line crosses the first signal line; and
providing a pixel electrode on the substrate on which the first signal line and the second signal line are provided,
wherein the electric field is generated by applying different voltages to the substrate and the nozzle, respectively,
further comprising:
before the forming the second signal line, providing a semiconductor pattern on the substrate on which the first signal line and a gate electrode are formed, wherein the gate electrode is connected to the first signal line and overlapping the semiconductor pattern; and
providing an organic layer including a trench formed thereon, wherein the trench of the organic layer partially exposes the semiconductor pattern, and
wherein the second signal line is formed on the trench of the organic layer.

8. The method of claim 7, further comprising:
providing a source electrode and a drain electrode before the forming the organic layer, wherein each of the source electrode and the drain electrode overlaps the semiconductor pattern, and
wherein the second signal line is in contact with the source electrode.

9. The method of claim 1, wherein the forming the first signal line comprising:
providing a mask including an open pattern between the substrate and the nozzle after the forming the trench on the substrate; and
injecting the conductive ink toward the trench on the substrate through the open pattern of the mask while a voltage is applied to the mask, wherein the open pattern of the mask corresponds to the trench, and
wherein a polarity of the voltage applied to the mask is the same as the polarity of a voltage applied to the nozzle.

* * * * *